(12) United States Patent
Tanimura

(10) Patent No.: US 6,784,684 B2
(45) Date of Patent: Aug. 31, 2004

(54) TESTING APPARATUS INCLUDING TESTING BOARD HAVING WIRINGS CONNECTED TO COMMON POINT AND METHOD OF TESTING SEMICONDUCTOR DEVICE BY COMPOSING SIGNALS

(75) Inventor: Masaaki Tanimura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 23 days.

(21) Appl. No.: 10/198,933

(22) Filed: Jul. 22, 2002

(65) Prior Publication Data

US 2003/0057940 A1 Mar. 27, 2003

(30) Foreign Application Priority Data

Sep. 25, 2001 (JP) ..................................... P2001-291008

(51) Int. Cl.[7] .............................................. G01R 31/26
(52) U.S. Cl. ..................................... 324/765; 324/73.1
(58) Field of Search ............................... 324/73.1, 765, 324/158.1; 714/814, 815, 700, 738; 702/89; 365/201

(56) References Cited

U.S. PATENT DOCUMENTS 3,659,044 A * 4/1972 Olson .......................... 348/183
3,903,477 A * 9/1975 Cronson et al. ............. 324/642
4,827,437 A * 5/1989 Blanton ........................ 702/89
5,058,087 A * 10/1991 Welzhofer et al. ........... 368/113
5,225,775 A * 7/1993 Sekino ...................... 324/158.1
6,563,298 B1 * 5/2003 Creek et al. ............... 324/158.1

FOREIGN PATENT DOCUMENTS

| JP | 58-201121 | 11/1983 |
| JP | 4-127073 | 4/1992 |
| JP | 5-26969 | 2/1993 |
| JP | 2000-137056 | 5/2000 |
| JP | 2000-314764 | 11/2000 |
| JP | 2001-194416 | 7/2001 |

* cited by examiner

Primary Examiner—David A. Zarneke
Assistant Examiner—Paresh Patel
(74) Attorney, Agent, or Firm—Oblon, Spivak, McClelland, Maier & Neustadt, P.C.

(57) ABSTRACT

In a testing board (300C), one end of each of a plurality of first wirings (310) and one end of each of a plurality of second wirings (320) are connected to a common point (340). The other end of each of the second wirings (320) is connected to a terminal (12a–12f) of a semiconductor device (10) under test. The second wirings (320) have almost the same length. Signals outputted from drivers of a tester pin (130) to the first wirings (310) are composed at the common point (340), and the composite wave is inputted to the terminal (12a–12f) through each of the second wirings (320). A relay (350) is provided at a midpoint of each of the second wirings (320) and is controlled such that the signals can be inputted to, for example, the terminal (12b) from the driver of the tester pin (130) through one of third wirings (330).

10 Claims, 11 Drawing Sheets

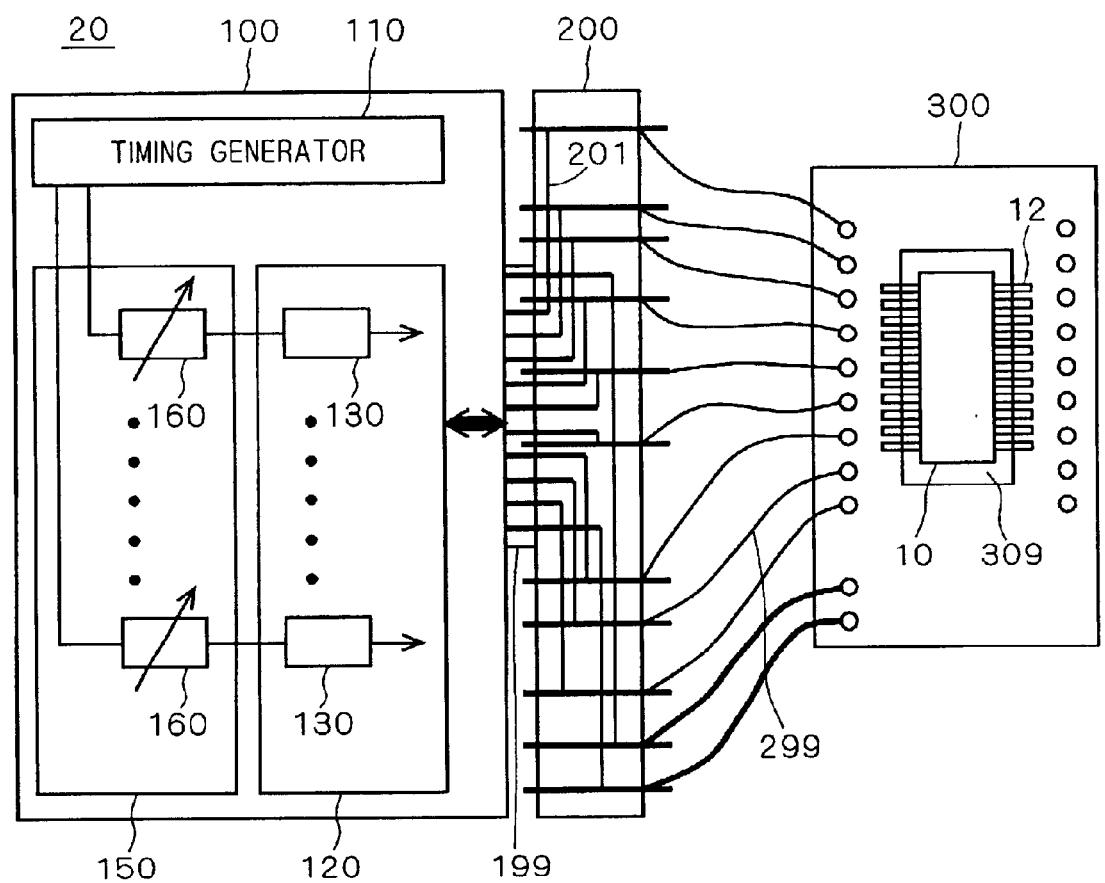
F I G. 1

F / G. 1 2 (PRIOR ART)
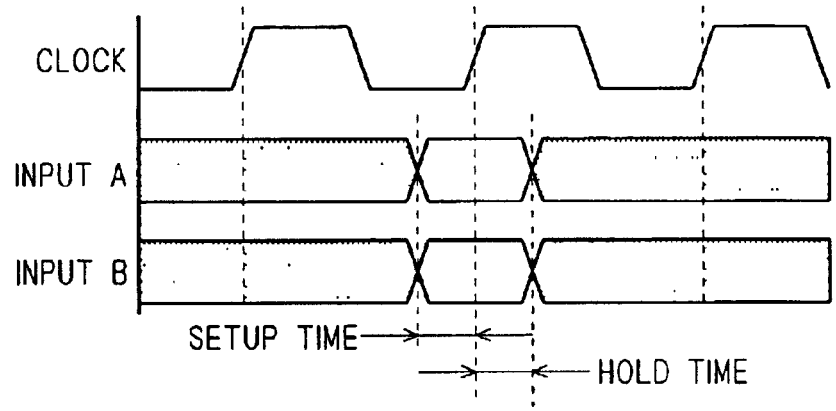
F / G. 1 3 (PRIOR ART)
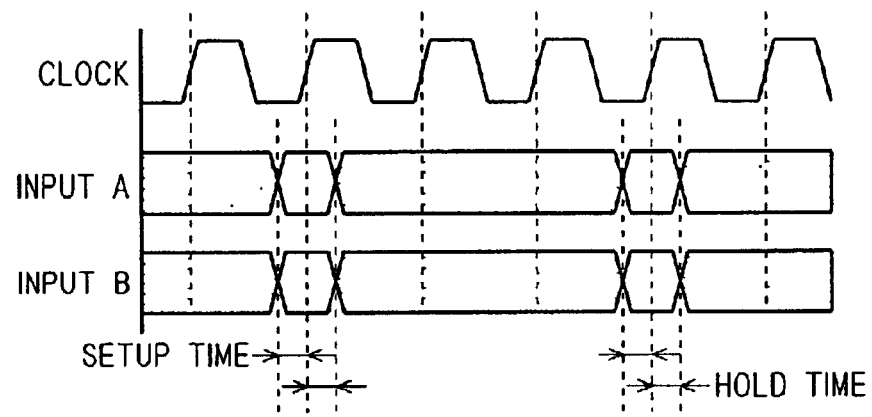
F / G. 1 4 (PRIOR ART)
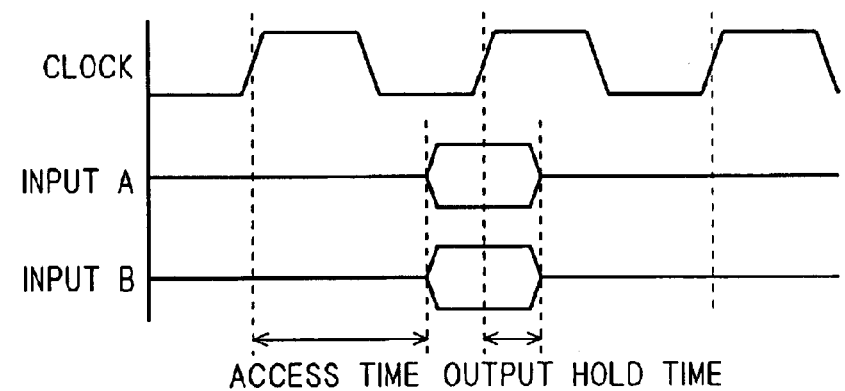

TESTING APPARATUS INCLUDING TESTING BOARD HAVING WIRINGS CONNECTED TO COMMON POINT AND METHOD OF TESTING SEMICONDUCTOR DEVICE BY COMPOSING SIGNALS

BACKGROUND OF THE INVENTION

1. Field of the Invention

The present invention relates to a testing apparatus and a method of testing a semiconductor device, and a more particularly to a technique for dispensing with or easing timing correction and temperature control and a technique for setting a skew rate of a signal (i.e., inclination of its waveform) at a desired or predetermined value for testing a semiconductor device.

2. Description of the Background Art

There is a growing demand that recent semiconductor integrated circuits should have increasingly faster response to and from external circuits. Particularly, semiconductor integrated circuits operating in synchronization with external clocks are becoming enhanced to have higher frequencies. With higher frequencies, a test rate is reduced, which results in a reduction in a setup time and a hold time of data that should be determined within the rate. For instance, each AC parameter (setup time, hold time and access time) between an external clock and a control signal is becoming smaller and smaller (see FIGS. 12 and 13 and FIGS. 14 and 15).

Therefore, an apparatus for testing a semiconductor integrated circuit needs to have capability of receiving and judging a high-frequency signal and to have a function of adjusting a timing shift or a phase shift (hereinafter also referred to as "skew") of each signal with high accuracy (hereinafter also referred to as "calibration"). For instance, in order to carry out an accurate testing of a device under test that uses specifications in which the testing apparatus is required to have a skew accuracy of at least±several tens of ps when a setup time is set at several hundreds of ps or less. Conventional calibration is discussed, for example, in Japanese Patent Application Laid-Open Nos. 58-201121 and 4-127073.

Now in reference to FIGS. 16 and 17, explanation will be given on a conventional timing correction method.

In general, a testing apparatus is provided with a pin electronics including a plurality of sets of a driver 131P and a comparator 132P (hereinafter also referred to as "tester pins"). The driver 131P receives a signal from a timing generator 110 to generate and output a test signal to a device under test (a semiconductor integrated circuit). The output signal of the driver 131P is lead to a wiring 330P on a testing board 300P through a relatively large general-purpose board and a coaxial cable, and is inputted to a terminal 12 of a semiconductor device 10 under test from the wiring 330P through a wiring of a socket 309. The semiconductor device 10 outputs a signal in response to the input signal, and the output signal from the device under test is received by the comparator 132P along the reverse path to the output signal of the driver 131P. The comparator 132P carries out a level judgment of the received signal at a predetermined timing. The testing apparatus is programmable to output and judge signals at various levels and timings such that semiconductor integrated circuits having various functions can be tested.

Timing correction on the plurality of tester pins is carried out using variable delay circuits 160P connected to input terminals of drivers 131P prior to the start of a test in such a manner that signals are inputted to respective terminals 12 of the semiconductor device 10 at the same timing.

Among conventional timing correction methods is a method of performing calibration with high accuracy at a socket end serving as a connecting part of electrically connecting a device under test and a testing apparatus. In this correction method, the timing is adjusted at each tester pin by using an oscilloscope or the reference comparator 133P.

Another conventional timing correction method is a method of adjusting a differential delay of a driver signal generated by a testing apparatus while measuring the delay with a comparator end of the testing apparatus in the state, for example, in which a jig dedicated for short-circuiting between pins of a socket is mounted on the socket.

Information acquired by timing adjustment is stored in the testing apparatus and is reflected as correction data per tester pin when conducting testing.

It is desirable that environments including the ambient temperature at timing adjustment are equivalent to those at conducting testing. This is because a discrepancy in environments between timing adjustment and testing results in a discrepancy in properties of respective components forming the timing generator 110 and the delay circuit 160P, which is a factor that causes an error.

Therefore, in recent testing apparatuses, a solution whose temperature is maintained almost constant, for example, is circulated, thereby preventing an increase in a temperature of a main circuit that is to be a key part of timing generation and the like in the testing apparatus due to the ambient temperature and self-heat-generation of the main circuit. With such temperature control, environments at calibration are maintained during testing, thereby achieving testing with high accuracy having a minimized error.

In light of the trend toward higher frequencies of signals, testing in consideration for the highest frequency is required. More specifically, an output signal of a driver is required to have fast rise and fall times. When a circuit having the standard of start and finish timings such as a setup time and a hold time at the level of 90% of a signal amplitude is tested with a signal having rise and fall times faster than those under an actual operation, operating conditions may be eased compared to those under the actual operation.

As described above, a conventional testing apparatus is required to have capability of receiving and judging a high-frequency signal and to have a function of adjusting a skew of each signal with high accuracy (calibration), which arises a problem in that adjustment of the testing apparatus becomes complicated. More specifically, adjusting a timing error to fall within the aforementioned range of±several tens of ps requires a complicated adjusting mechanism and a mechanism for maintaining it. Moreover, periodic verifications and recorrections become necessary in order to maintain adjusted properties constant with the passage of time.

There is another problem in that the conventional testing apparatus includes temperature control means for equalizing environments at timing adjustment and at testing, which thus becomes complicated and expensive.

With the aforementioned trend toward higher frequencies of signals, an output signal of a driver is required to have fast rise and fall times. This, however, arises still another problem in that the rise and fall times of the output signal of the driver are generally determined as properties of a driver chip in the conventional testing apparatus, and cannot be adjusted, for example, by a program of the testing apparatus to various values.

SUMMARY OF THE INVENTION

An object of the present invention is to provide a testing apparatus and a method of testing a semiconductor device, capable of dispensing with or easing timing correction and temperature control.

Another object of the present invention is to provide a method of obtaining a signal having a predetermined slew rate (inclination of waveform) and testing a semiconductor device with the signal.

The testing apparatus according to the present invention includes a test circuit including a pin electronics. The pin electronics includes a plurality of drivers, each of which can output signals having various waveforms. The testing apparatus further includes a testing board for electrically connecting the test circuit and a semiconductor device under test. The testing board includes a plurality of first wirings each having one end connected to a common point and the other end connected to one of the plurality of drivers, and a plurality of second wirings each having one end connected to the common point and the other end connected to a terminal of the semiconductor device.

With the testing apparatus, a signal is inputted to the other end of each of the first wirings such that a plurality of signals are composed at the common point (generation of composite wave), and the composite wave is inputted to each terminal of the semiconductor device under test through each of the second wirings. Since the composite wave is inputted to each of the terminals of the semiconductor device in this way, the signals inputted to the terminals can be brought into phase with each other. Thus, it is possible to dispense with timing correction for aligning the phase of the signals inputted to the respective terminals of the semiconductor device or to ease the accuracy of adjustment of such timing correction. This can achieve an improved productivity of a semiconductor device. Further, since timing correction becomes unnecessary or simplified, it is possible to dispense with or ease temperature control and equipment for equalizing the ambient temperature at timing correction with that at an actual testing. Therefore, a low-cost testing apparatus having a simple configuration can be provided.

The method of testing a semiconductor device according to the present invention is performed by inputting a plurality of signals to terminals of a semiconductor device under test, the plurality of signals are composed to generate a composite wave, and the composite wave is inputted to each of the terminals of the semiconductor device.

With the method, since the composite wave is inputted to each of the terminals of the semiconductor device, the signals inputted to the respective terminals can be brought into phase with each other. Thus, it is possible to dispense with timing correction for aligning the phase of the signals inputted to the respective terminals of the semiconductor device or to ease the accuracy of adjustment of such timing correction. Further, since timing correction becomes unnecessary or simplified, it is possible to dispense with or ease temperature control and equipment for equalizing the ambient temperature at timing correction with that at an actual testing.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic view illustrating a testing apparatus according to a first preferred embodiment of the present invention;

FIGS. 12 to 15 are waveform charts illustrating a reduction in an AC parameter resulting from higher frequencies;

DESCRIPTION OF THE PREFERRED EMBODIMENTS

<First Preferred Embodiment>

Figure 2:
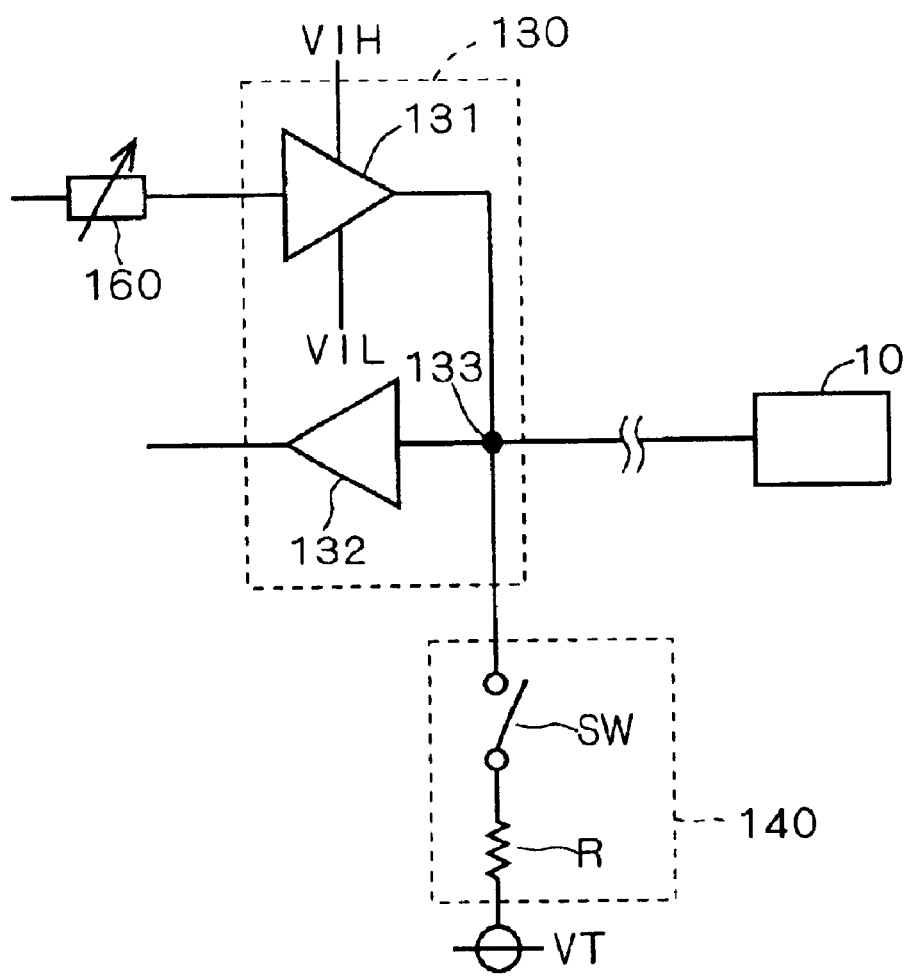
FIG. 2 is a circuit diagram illustrating a pin electronics according to the first preferred embodiment.

FIG. 1 is a schematic view illustrating a testing apparatus 20 according to the first preferred embodiment. As shown in FIG. 1, the testing apparatus 20 comprises a test circuit 100, a general-purpose board 200, a testing board (also referred to as "socket board") 300, connectors 199 and coaxial cables 299.

More specifically, the test circuit 100 comprises a timing generator 110, a timing adjusting circuit 150 including a plurality of variable delay circuits 160 and a pin electronics 120 including a plurality of tester pins 130 and impedance matching elements 140 (see FIG. 2). Each tester pin 130 is connected to the timing generator 110 through a corresponding one of the variable delay circuits 160.

FIG. 2 is a circuit diagram illustrating a specific configuration of a tester pin 130. The tester pin 130 includes a driver 131 and a comparator 132. Power supplies VIH and VIL are connected to the driver 131. Output potentials of the power supplies VIH and VIL are indicated by the codes VIH and VIL, and are expressed in this case as potential VIH>potential VIL. An output terminal of the driver 131, an input terminal of the comparator 132 and an impedance matching element 140 are connected to a node 133. The node 133 is connected to the semiconductor device under test or the semiconductor integrated circuit 10 through the general-purpose board 200 and the like.

The impedance matching element 140 includes a switch SW and a resistor R connected in this order to the node 133 (thus, to the input terminal of the comparator 132), and the resistor R is connected to a power supply VT (whose output potential is indicated by the code VT). The resistor R and the potential VT are so-called terminating resistor and terminating potential as will be described later.

In the test circuit 100, a (pulse) signal (or a (pulse) waveform) generated by the timing generator 110 is adjusted for its transition timing by a corresponding one of the variable delay circuits 160, and the adjusted signal is inputted to the driver 131. The driver 131 outputs the potential VIL or VIH in response to the inputted signal. That is, the driver 131 outputs a pulse that transits from the potential VIL to VIH or a pulse that transits from VIH to VIL. At this time, the test circuit 100 can output signals having various waveforms through the plurality of tester pins 130 according to settings of the amount of delay at each of the variable delay circuits 160 and settings of the directions of transition of the potentials VIL and VIH in an output signal at each driver (that means various output waveforms are programmable).

In the test circuit 100, the comparator 132 receives a signal from the semiconductor device 10 under test and carries out a predetermined judgment (level judgment) based on the received signal to output a judgment result, as will be described later. Illustration of the circuit configuration beyond the output terminal of the comparator 132 is omitted.

The pin electronics 120, i.e., the tester pins 130 are connected to the testing board 300 through the connectors 199, the general-purpose board 200 and the coaxial cables 299.

The general-purpose board 200 serves to set the order of wirings of the connector 199 in correspondence to the order of the coaxial cables 299 (i.e., holes 302 and 303 of the testing board 300 which will be described later), and is provided with wirings 201 for this purpose. Thus, the general-purpose board 200 is substituted with another as necessary according to the types of the connector 199 and the testing board 300 (i.e., the type of the semiconductor device 10 under test).

Figure 3:
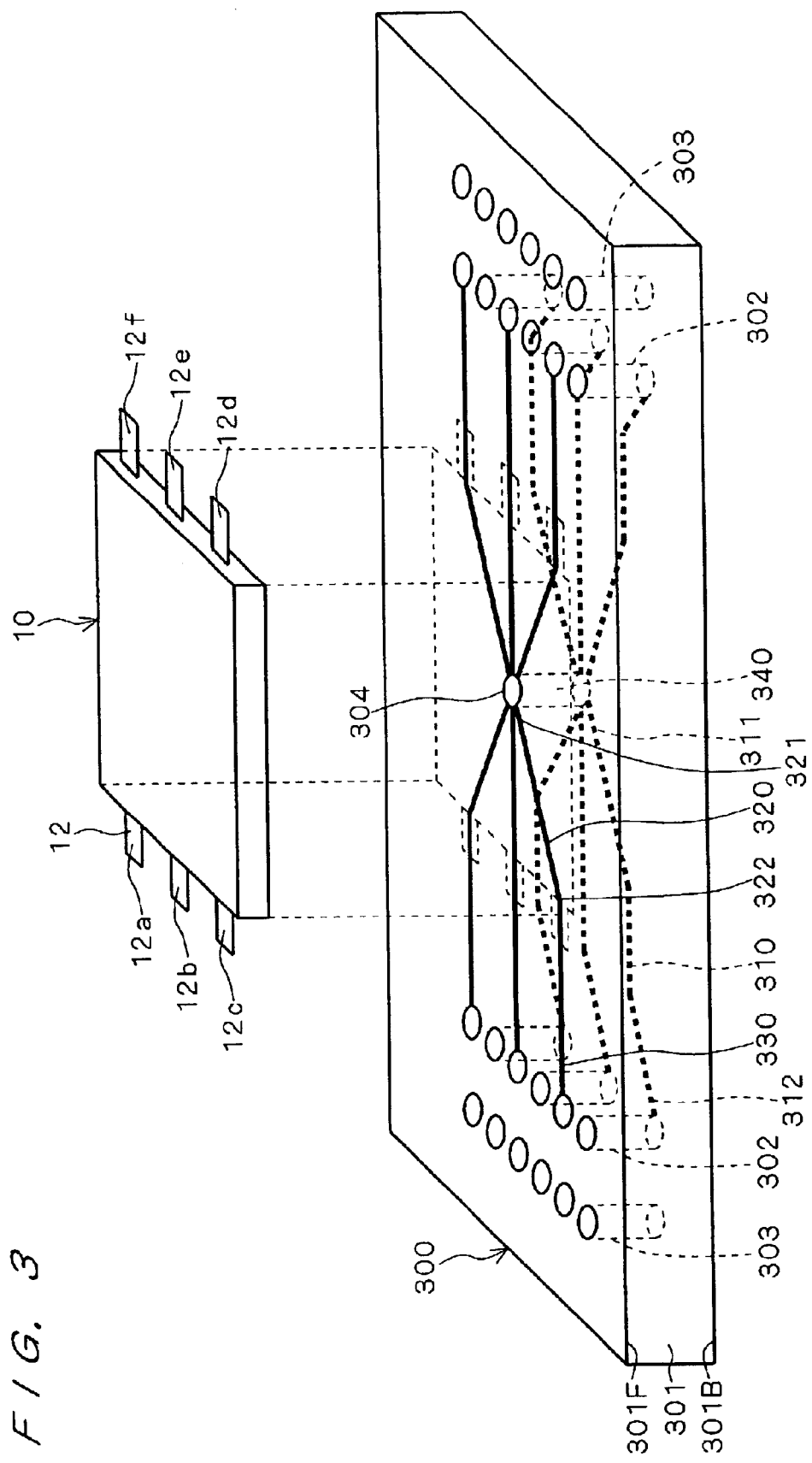
FIG. 3 is a perspective view illustrating a testing board according to the first preferred embodiment.
Figure 4:
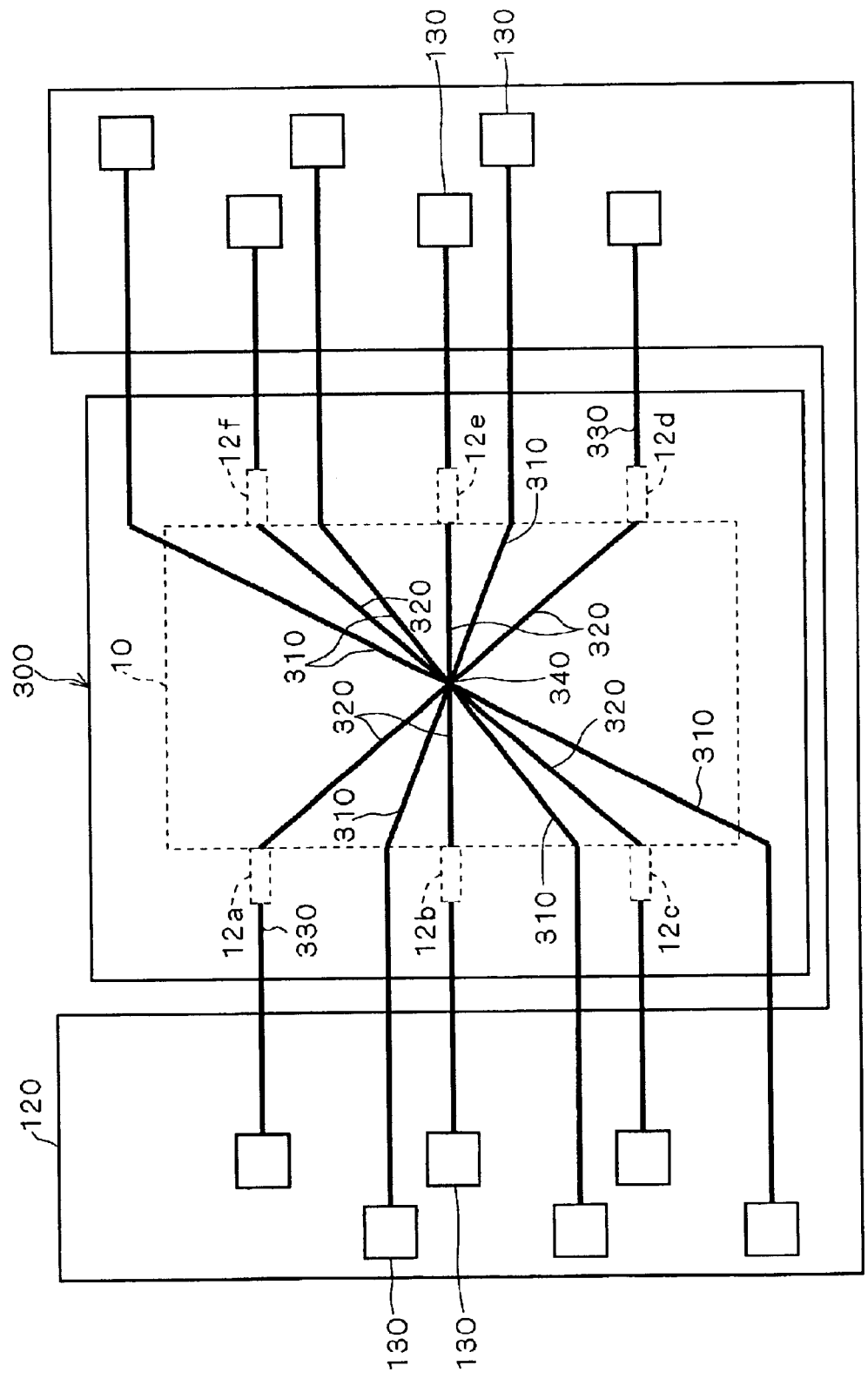
FIG. 4 is a schematic view illustrating the testing apparatus according to the first preferred embodiment.
Figure 17:
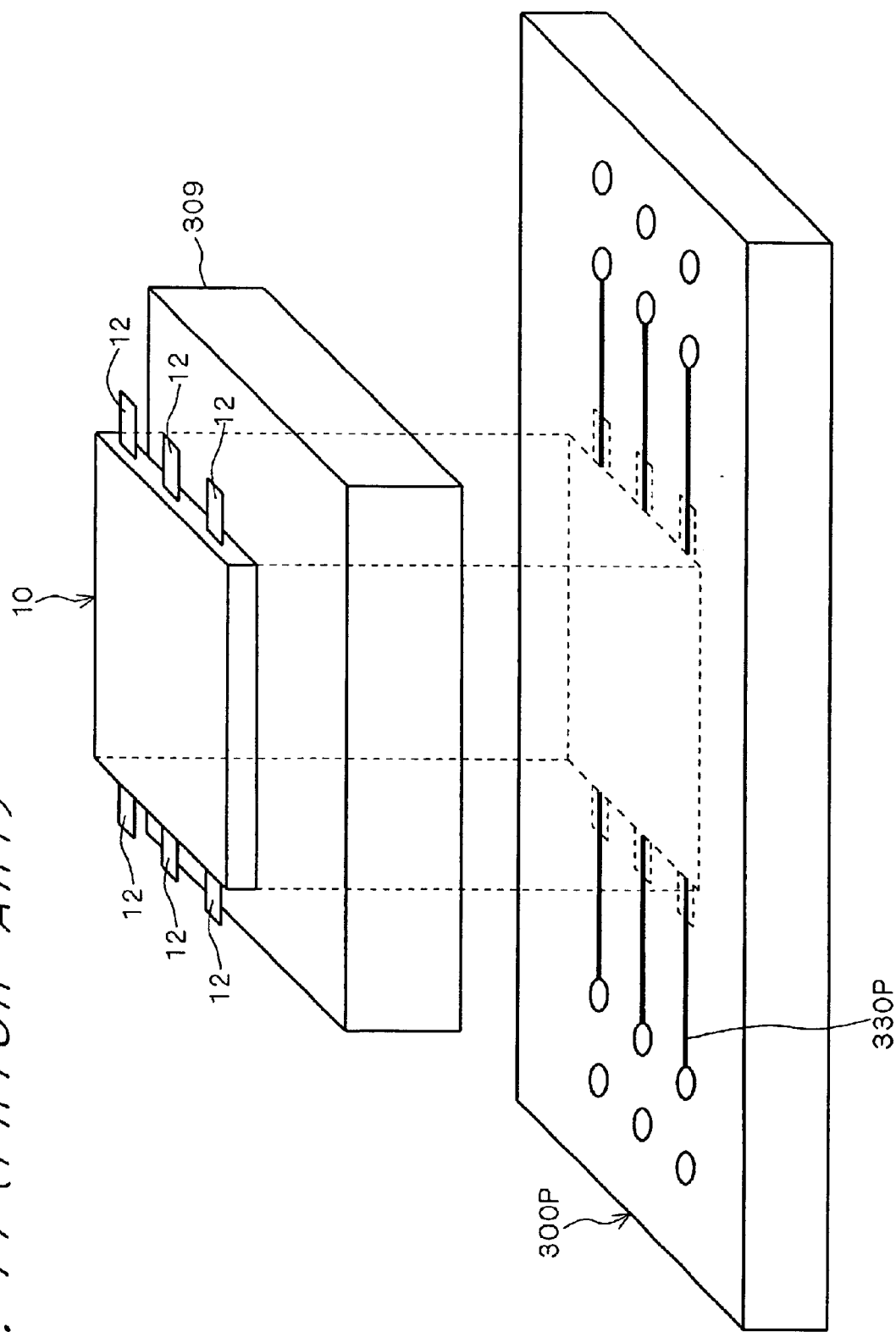
FIG. 17 is a schematic view illustrating a conventional testing board.

FIG. 3 is a perspective view illustrating the testing board 300, and FIG. 4 is a schematic view illustrating the pattern of connection in the testing apparatus 20. For easier explanation, description will be given as an example on the case in which the semiconductor device 10 under test has six terminals 12 (also referred to as terminals 12a to 12f, respectively). For eliminating the complexity of the drawing, illustration of the socket 309 (see FIGS. 1 and 17) is omitted in FIGS. 3 and 4.

The testing board 300 comprises a base material 301 made of a plate-like insulative member such as resin, a plurality of first, second and third wirings 310, 320 and 330 all formed on the base material 301 and the socket 309. More specifically, the base material 301 is provided with holes 302, 303 and 304 formed in its thickness direction (extending from a front surface 301F to a bottom surface 301B).

The plurality of first wirings 310 are formed on the bottom surface 301B of the base material 301. One end 311 of each of the first wirings 310 is connected to the (one) hole 304 while the other end 312 of each of the first wirings 310 is connected to a corresponding one of the holes 302. The plurality of second and third wirings 320 and 330 are formed on the front surface 301F of the base material 301. One end 321 of each of the second wirings 320 is connected to the hole 304 while the other end 322 of each of the second wirings 320 is connected to a corresponding one of the holes 302 through a corresponding one of the third wirings 330. The third wirings 330 are connected to corresponding ones of the holes 302 different from those to which the first wirings 310 are connected.

The above-described hole 304 is provided with a conductive material (not shown for eliminating the complexity of the drawing) on its inner surface, for example, and the plurality of first wirings 310 and second wirings 320 are connected in common by this conductive material. A point of common connection is called "common point 340", and the hole 304 is called "common point hole 304" as well.

Although not shown in FIG. 3 for eliminating the complexity of the drawing, signal lines of the coaxial cables 299 are connected to the holes 302 and GND lines of the coaxial cables 299 are connected to the holes 303. Accordingly, the third wirings 330 and the other end 312 of each of the first wirings 310 are connected to corresponding ones of the tester pins 130 of the test circuit 100. Particularly, the other end 322 of each of the second wirings 320 (thus, each of the third wirings) is connected to a terminal of the semiconductor device 10 through a wiring of the socket 309. With such pattern of connection, the testing board 300 electrically connects the semiconductor device 10 under test and the test circuit 100. Impedance matching is given to the wirings 310, 320 and 330 of the testing board 300, the coaxial cables 299, the general-purpose board 200, the connectors 199 and the like in such a manner that a reflected wave is not generated at connections.

At this time, the common point 340 is placed in such a position that the plurality of second wirings 320 all have almost the same strength. The common point 304 is placed in a position on the testing board 300 facing substantially the center of the semiconductor device 10, and the first, second and third wirings 310, 320 and 330 extend substantially radially from the common point 340.

Next, referring to the timing chart of FIG. 5 in addition to the above-described drawings, an operation of the testing apparatus 20 (and a method of testing the semiconductor device 10 using the testing board 300) will be described. When the drivers 131 of the tester pins 130 connected to the first wirings 310 each output a test signal, skews might occur between these signals at the other end 312 (or the end 311) of each of the first wirings 310 similarly to signals S310 shown in FIG. 5.

Figure 5:
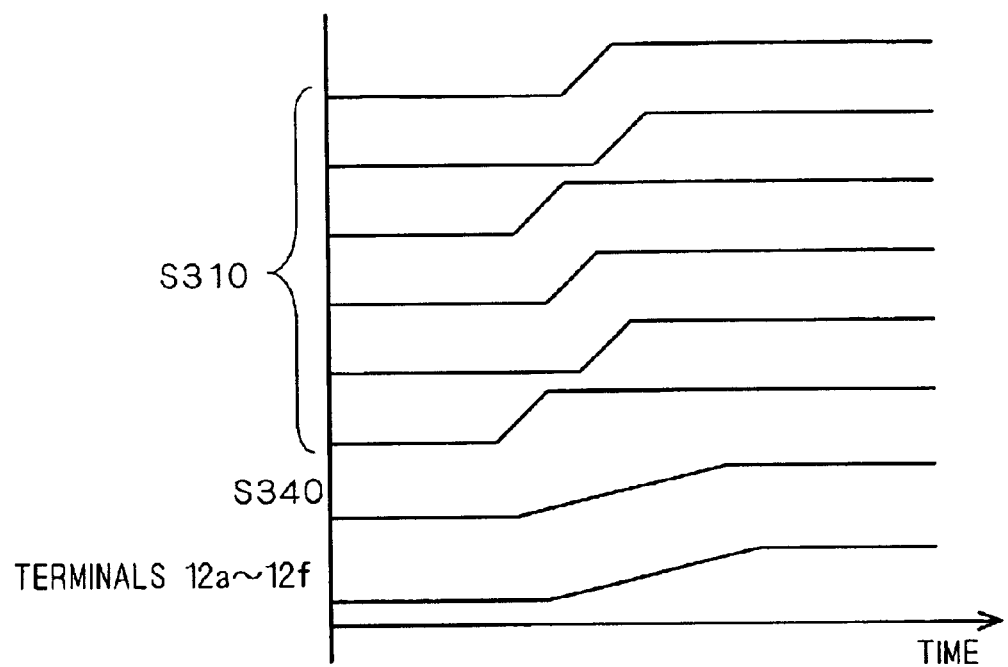
FIG. 5 is a timing chart illustrating an operation of the testing apparatus according to the first preferred embodiment.

In particular, since the first wirings 310 are connected to the common point 340, the test signals S310 are composed at the common point 340 to be a signal or a composite wave S340 shown in FIG. 5. The composite wave S340 as a transmitted wave from the common point 340 is inputted to each of the terminals 12a to 12f of the semiconductor device 10 under test through a corresponding one of the second wirings 320.

The semiconductor device 10 outputs a test result signal through each of the terminals 12a to 12f in response to the inputted signal S340, and the test result signal is inputted to the comparator 132 of a corresponding one of the tester pins 130 through a corresponding one of the third wirings 330. The comparator 132 carries out a predetermined judgment based on the test result signal as received.

In light of such an operation and testing method, the composite wave S340 can be generated at least with the driver 131 being connected to each of the first wirings 310, and judgment can be made on the test result signal at least with the comparator 132 being connected to each of the second wirings 320 (through a corresponding one of the third wirings 330).

In the impedance matching element 140 connected to each of the terminals 12a to 12f, bringing the switch SW into the closed position makes it possible to prevent the test result signal from being reflected at the node 133 (i.e., at the input terminal of the comparator 132). In other words, the resistor R is a so-called terminating resistor having such a resistance value that a reflection wave is not generated at the node 133

(such that impedance matching is given). The potential VT is a so-called terminating potential, which allows the comparator 132 to carry out a predetermined judgment with high accuracy.

As has been described, the composite wave S340 is inputted to each of the terminals 12a to 12f of the semiconductor device 10 in the testing apparatus 20, which allows signals inputted to the respective terminals 12a to 12f to be in phase with one another. At this time, since the signals are composed on the testing board 300, the composite wave S340 can be generated in the vicinity of the semiconductor device 10 under test compared to the case of generating it within the test circuit 100 or on the general-purpose board 200. Further, the second wirings 320 have length sufficiently shorter than the distance between the driver 131 and the common point 340, which makes the phase shift (skew) almost negligible between one composite wave S340 propagating through one of the second wirings 320 and another. Particularly, since the second wirings 320 have almost the same length, it is possible to sufficiently control (or suppress) the phase shift between one composite wave S340 propagating through one of the second wirings 320 and another. In this way, the testing apparatus 20 is capable of sufficiently controlling the phase shift between signals S340 inputted to the respective terminals 12a to 12f of the semiconductor device 10.

As a result, it is possible to dispense with timing correction for aligning the phase of signals inputted to the respective terminals 12a to 12f of the semiconductor device 10 or to ease the accuracy of adjustment in such timing correction. This can achieve an improved productivity of a semiconductor device. Further, since timing correction becomes unnecessary or simplified, it is possible to dispense with or ease temperature control and equipment for equalizing the ambient temperature at timing correction with that at an actual testing. Therefore, a low-cost testing apparatus 20 having a simple configuration can be obtained.

Figure 6:
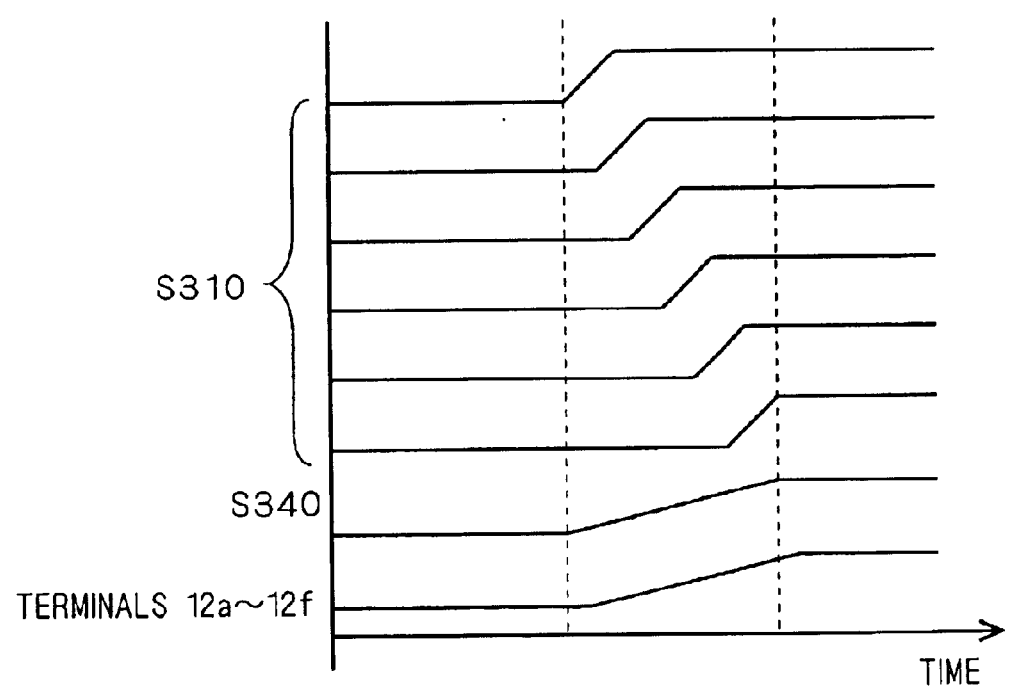
FIG. 6 is a timing chart illustrating another operation of the testing apparatus according to the first preferred embodiment.

Since the composite wave S340 is composed of a plurality of signals S310 as composed, the slew rate (inclination of waveform) of the composite wave S340 can be varied by shifting the phase of any one or more signals S310 shown in FIG. 5. That is, adjustment of the phase between the plurality of signals S310 makes it possible to adjust the slew rate of the composite wave S340 to a desired or predetermined value. Although an accurate timing correction is not required at this time either, it is possible to adjust the slew rate of the composite wave S340 by performing timing correction of the signals S310 similarly to a conventional timing correction and thereafter shifting the phase of the signals S310 sequentially by a predetermined amount as shown in the timing chart of FIG. 6.

With such adjustment of the slew rate, which only requires adjustment of the phase between a plurality of signals, various slew rates can easily be obtained without the need of conducting work on a large scale such as replacing components of the test circuit 100.

Figure 7:
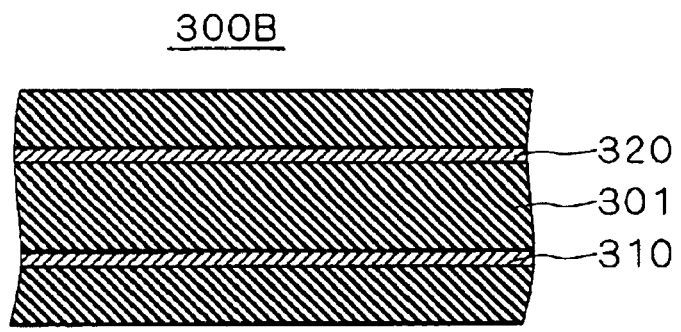
FIG. 7 is a sectional view illustrating another testing board according to the first preferred embodiment.

In place of the testing board 300, a testing board 300B in which the first to third wirings 310, 320 and 330 are buried in the base material 301 as shown in the sectional view of FIG. 7 (i.e., having a configuration of so-called multilayer interconnection substrate) may be applied to the testing apparatus 20. Alternatively, in place of the testing board 300, a testing board may be used in which all of the first to third wirings 310, 320 and 330 are formed on the front surface 301F or the bottom surface 301B of the base material 301. In this case, the first to third plurality of wirings 310, 320 and 330 are placed in different positions from one another in the thickness direction of the testing board, which allows a reduction of patterning densities of the wirings compared to the case of placing the wirings in the same position (e.g., on the front surface 301F). This facilitates patterning of the first to third wirings 310, 320 and 330.

Figure 8:
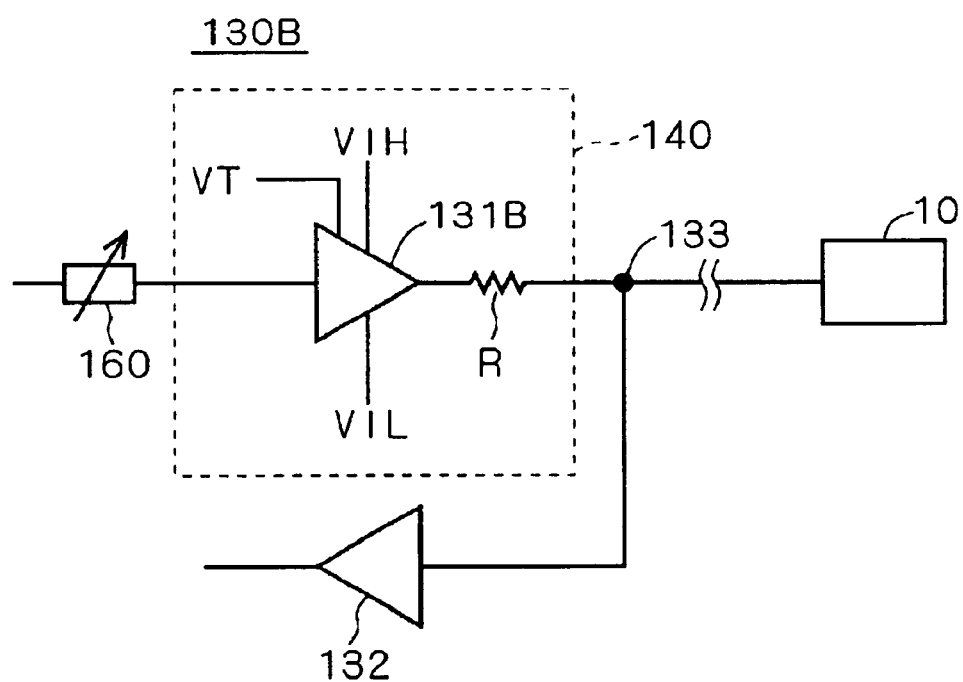
FIG. 8 is a circuit diagram illustrating another pin electronics according to the first preferred embodiment.

Further, in place of the unit element composed of the tester pin 130 and the impedance matching element 140 (FIG. 2), the pin electronics 120 may be composed of a tester pin 130B shown in the circuit diagram of FIG. 8. The tester pin 130B includes the driver 131B, the comparator 132 and the resistor R. The driver 131B has its output terminal connected to the node 133 through the resistor R, and the comparator 132 has its input terminal connected to the node 133. Particularly, the power supply VT is connected to the driver 131B in addition to the aforementioned power supplies VIH and VIL, so that the driver 131B is capable of outputting the potential VT. In this case, the element including the driver 131B and the resistor R corresponds to the above-described impedance matching element 140. The tester pin 130B and the above unit element shown in FIG. 2 may be mixed in the pin electronics 120.

<Second Preferred Embodiment>

The testing board, the testing apparatus and the testing method according to the first preferred embodiment are suitable for a test in which signals having the same waveform are inputted to all of the terminals 12 of the semiconductor device 10 under test. However, there is another test in which signals having different waveforms from one another are inputted to the plurality of terminals 12. Therefore, explanation will be given in the present embodiment on a testing board, a testing apparatus and a testing method applicable to both cases of inputting signals having the same waveform and inputting signals having different waveforms from one another, respectively, to the plurality of terminals 12.

Figure 9:
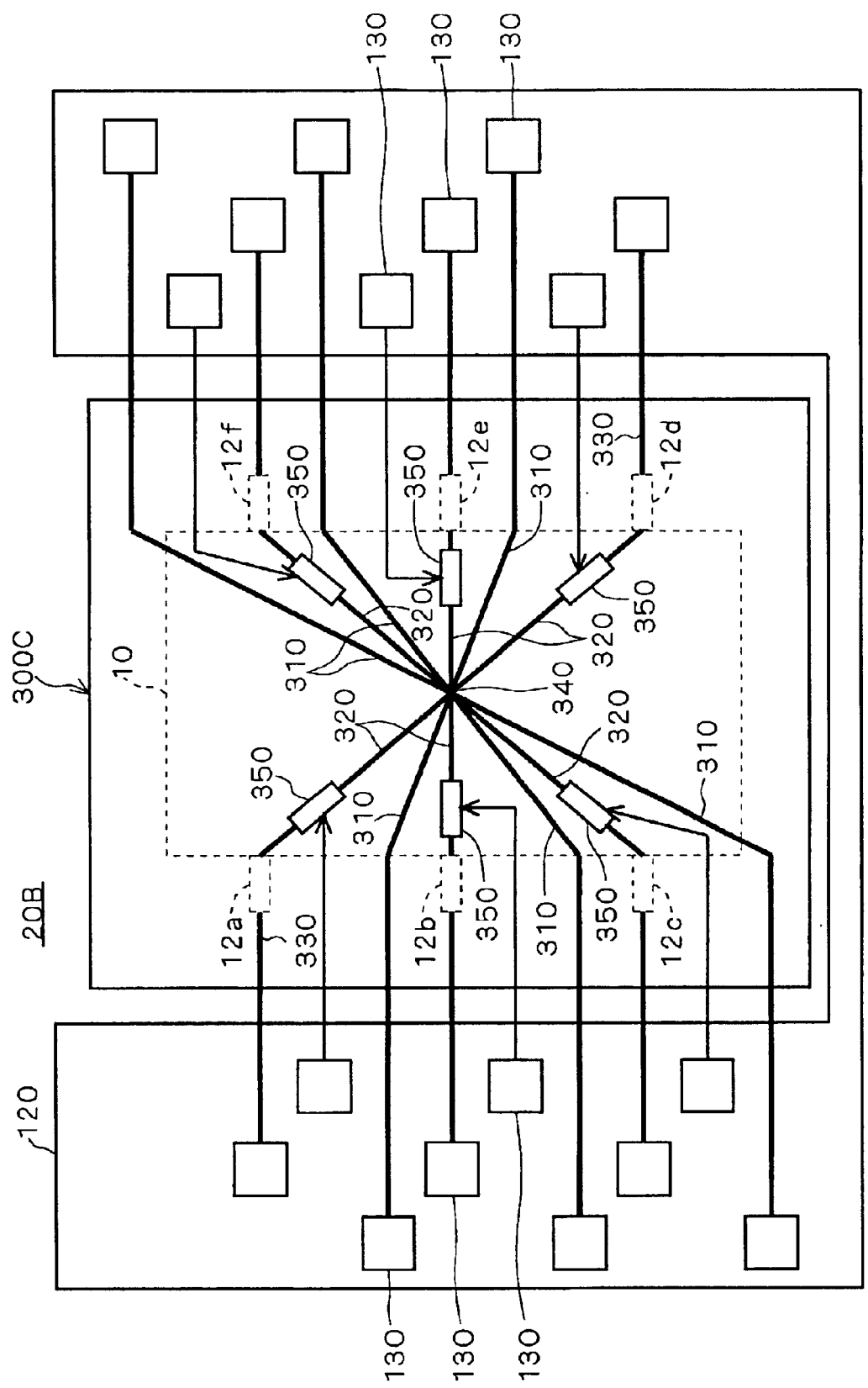
FIG. 9 is a schematic view illustrating a testing apparatus according to a second preferred embodiment of the present invention.

FIG. 9 is a schematic view illustrating a pattern of connection in a testing apparatus 20B according to the present embodiment. As shown in FIG. 9, a testing board 300C further comprises a plurality of relays (or switches) 350 in addition to the configuration of the above-described testing board 300. More specifically, each of the relays 350 is provided at a midpoint of each of the wirings 320 or between the common point 340 and one of the terminals 12 of the semiconductor device 10. Thus, connection/disconnection of each of the second wirings 320 is controlled by bringing each of the relays 350 into the open/closed position. Needless to say, the relays 350 may be substituted by various kinds of switches.

As described above, the test circuit 100 is capable of outputting signals having various waveforms from the plurality of drivers 131. Thus, especially in the testing apparatus 20B, each of the relays 350 has its control terminal connected to a corresponding one of the tester pins 130, thereby bringing the relays 350 into the open/closed position based on signals from the tester pins 130. This enables control of the relays 350 without providing an extra circuit.

The testing apparatus 20B has the same configuration as that of the above-described testing apparatus 20 except for the above-described part.

Figure 10:
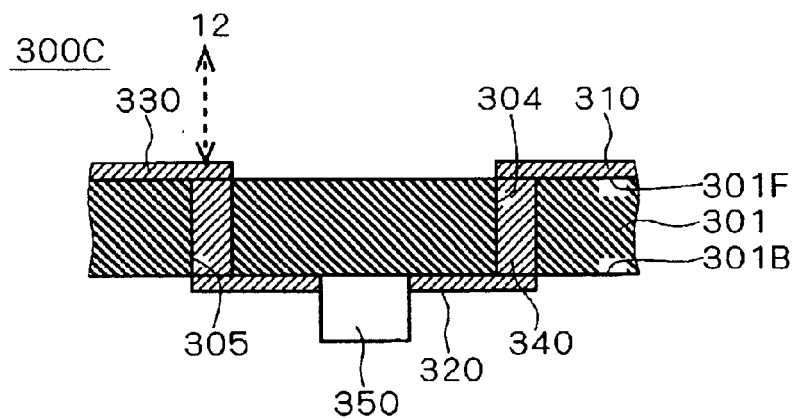
FIG. 10 is a sectional view illustrating a testing board according to the second preferred embodiment.

The relays 350 may be arranged on the testing board 300C as shown in the sectional view of FIG. 10, for example. That is, the first wirings 310 are provided on the front surface 301F of the base material 301 and the second wirings 320 and relays 350 are provided on the bottom surface 301B. The first wirings 310 and the second wirings 320 are connected in common through the common point 340 or the common point hole 304. The third wirings 330 are provided on the front surface 301F, and the hole 305 is formed in the base material 301, so that the second wirings 320 and the third wirings 330 are connected through a conductive material in the hole 305. In the testing board 300C having such configuration, the third wirings 330 (and, electrically saying, the other ends 322 of each of the second wirings 320) are connected to the terminals 12 of the semiconductor device 10 through wirings of the socket 309.

In the testing apparatus 20B, bringing one or more relays 350 into the open position causes one or more corresponding ones of second wirings 320 to be disconnected. Thus, the composite wave S340 cannot reach the other end(s) 322 of the disconnected one(s) of the second wirings 320. In other words, the relays 350 control input/non-input of the composite wave S340 into the terminals 12 of the semiconductor device 10. Further, such control can be performed at each of the relays 350, thus, at each of the terminals 12 of the semiconductor device 10. Accordingly, it is possible to provide terminal(s) 12 of the semiconductor device 10 connected to the other end(s) 322 of the disconnected one(s) of the second wirings 320 with an input of signals (e.g., clocks which takes in another signal at edge input) having a waveform different from that of signals inputted to the remainder of the terminals 12 connected to the remainder of the second wirings 320 being in the connected state.

Figure 11:
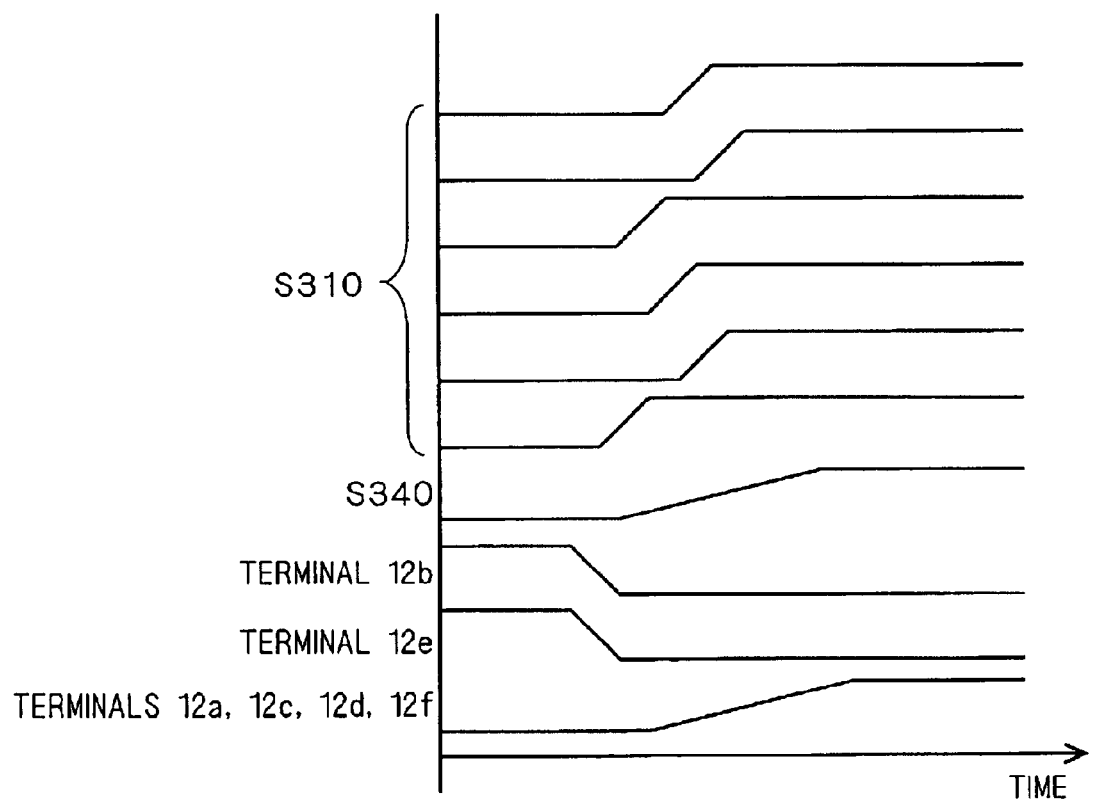
FIG. 11 is a timing chart illustrating an operation of the testing apparatus according to the second preferred embodiment.
Figure 15:
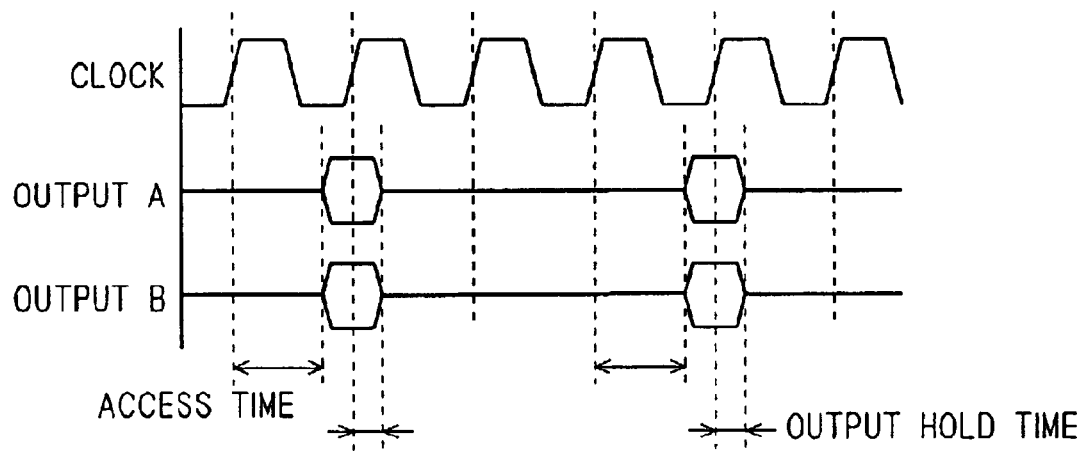
Figure 16:
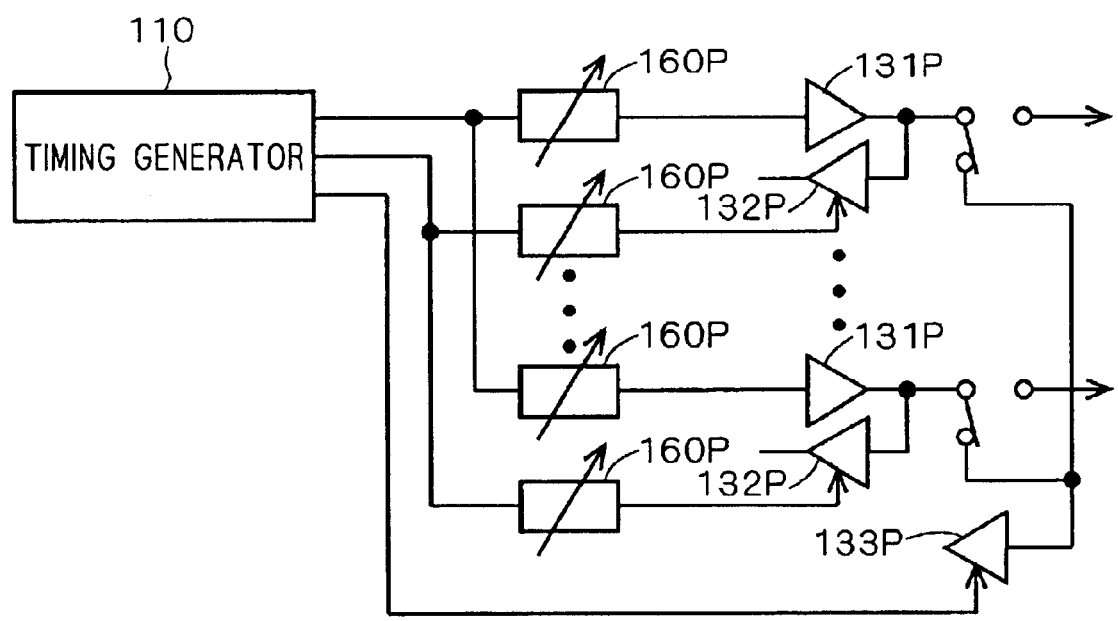
FIG. 16 is a circuit diagram illustrating conventional timing correction.

For instance, when bringing two of the second wirings 320 connected to the terminals 12b and 12e of the semiconductor device 10, respectively, into the disconnected state, it is possible to input a signal having a waveform different from that of the composite wave S340 (a signal having a waveform reversed to the waveforms of the signals S310 in High/Low in the example shown in the timing chart of FIG. 11) to the terminals 12b and 12e, respectively. At this time, a test signal is inputted to each of the terminals 12b and 12e from the driver 131 of a corresponding one of the tester pins 130 through a corresponding one of the third wirings 330, and a test result signal from each of the terminal 12b and 12e is received at the comparator 132 of the above-noted corresponding one of the tester pins 130. In this case, before starting a test, the phase difference or timing between the signal to be inputted to each of the terminals 12b and 12e and the composite wave S340 at the common point 340 is adjusted using an arbitrary comparator 132 selected by opening/closing of relays 350. The use of signals having waveforms reversed to each other enables a test that takes into account interference between the signals or between the wirings in the semiconductor device 10, for example.

As has been described, the operation of the testing apparatus 20B and the method of testing the semiconductor device 10 using the testing board 300C are applicable to both of the cases of inputting signals having the same waveform to the plurality of terminals 12 and inputting signals having different waveforms, and various kinds of tests can be performed. Although the above description has referred to the case of providing the relays 350 for all the second wirings 320, the relays 350 may be provided for one or more second wirings 320 as necessary.

While the invention has been shown and described in detail, the foregoing description is in all aspects illustrative and not restrictive. It is therefore understood that numerous modifications and variations can be devised without departing from the scope of the invention.

What is claimed is:

1. A testing apparatus comprising:
    a testing circuit including pin electronics, said pin electronics including a plurality of drivers, each of which can output signals having various waveforms; and
    a testing board for electrically connecting said test circuit and a semiconductor DUT, wherein
    said testing board includes:
    a plurality of first wirings each having one end connected to a common point and the other end connected to one of said plurality of drivers; and
    a plurality of second wirings each having one end connected to said common point and the other end connected to terminals of said semiconductor device.

2. The testing apparatus according to claim 1, wherein
    said pin electronics further includes:
    a plurality of comparators each configured to perform a predetermined judgment upon receipt of a signal from said terminal of said semiconductor device; and
    a plurality of impedance matching elements connected to input terminals of said plurality of comparators.

3. The testing apparatus according to claim 1, further comprising:
    at least one switch provided at a midpoint of at least one of said plurality of second wirings, wherein
    at least one of said plurality of drivers is connected to said other end of said at least one of said plurality of second wirings.

4. The testing apparatus according to claim 3, wherein
    said at least one switch is controlled by at least another one of said plurality of drivers.

5. The testing apparatus according to claim 1, wherein
    said second wirings have almost the same length.

6. The testing apparatus according to claim 1, wherein
    said plurality of first wirings and said plurality of second wirings are arranged in different positions from each other in the thickness direction of said testing board.

7. A method of testing a semiconductor device comprising:
    inputting a plurality of signals to terminals of a semiconductor DUT, each signal output from one of a plurality of drivers,
    generating a composite wave from said plurality of signals, and
    inputting said composite wave to each of said terminals of said semiconductor device.

8. The method according to claim 7, wherein
    a phase between said plurality of signals is adjusted, thereby adjusting a slew rate of said composite wave.

9. The method according to claim 7, wherein
    said plurality of signals are composed on a testing board for electrically connecting said semiconductor device and a test circuit.

10. The method according to claim 7, wherein
    input/non-input of said composite wave is controlled for each of said terminals of said semiconductor device.

* * * * *